United States Patent
Chern et al.

(10) Patent No.: US 7,084,453 B2
(45) Date of Patent: Aug. 1, 2006

(54) METHOD OF FORMING DIFFERENT OXIDE THICKNESS FOR HIGH VOLTAGE TRANSISTOR AND MEMORY CELL TUNNEL DIELECTRIC

(75) Inventors: Geeng-Chuan Chern, Cupertino, CA (US); Amitay Levi, Cupertino, CA (US); Dana Lee, Santa Clara, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 0 days.

(21) Appl. No.: 10/850,300

(22) Filed: May 19, 2004

(65) Prior Publication Data
US 2004/0212007 A1    Oct. 28, 2004

Related U.S. Application Data

(62) Division of application No. 10/008,204, filed on Dec. 5, 2001, now abandoned.

(51) Int. Cl.
H01L 21/8238 (2006.01)
H01L 21/336 (2006.01)
H01L 29/788 (2006.01)
H01L 29/792 (2006.01)

(52) U.S. Cl. .............. 257/315; 257/321; 257/322; 257/326; 438/201; 438/257; 438/981

(58) Field of Classification Search .......... 257/321, 257/315, 322, 326, 316; 438/257, 201, 981
See application file for complete search history.

(56) References Cited

U.S. PATENT DOCUMENTS

| | | | |
|---|---|---|---|
| 4,757,360 A | 7/1988 | Farone | |
| 4,794,565 A | 12/1988 | Wu et al. | |
| 4,882,707 A | 11/1989 | Mizutani | |
| 4,931,847 A | 6/1990 | Corda | |
| 4,947,221 A | 8/1990 | Stewart et al. | |
| 5,021,848 A | 6/1991 | Chiu | |
| 5,029,130 A | 7/1991 | Yeh | |
| 5,041,886 A | 8/1991 | Lee | |
| 5,101,250 A | 3/1992 | Arima et al. | |
| 5,268,319 A | 12/1993 | Harari | |
| 5,429,965 A | 7/1995 | Shimoji | |
| 5,455,792 A | 10/1995 | Yi | |
| 5,544,103 A | 8/1996 | Lambertson | |
| 5,572,054 A | 11/1996 | Wang et al. | |
| 5,767,551 A | 6/1998 | Smayling et al. | |
| 5,780,341 A | 7/1998 | Ogura | |
| 5,780,892 A | 7/1998 | Chen | |
| 5,789,293 A | 8/1998 | Cho et al. | |

(Continued)

FOREIGN PATENT DOCUMENTS

EP  0 389 721 A2  10/1990

*Primary Examiner*—Nathan J. Flynn
*Assistant Examiner*—Victor A. Mandala, Jr.
(74) *Attorney, Agent, or Firm*—DLA Piper Rudnick Gray Cary US LLP

(57) ABSTRACT

A semiconductor memory device and method for making the same, where a memory cell and high voltage MOS transistor are formed on the same substrate. An insulating layer is formed having a first portion that insulates the control and floating gates of the memory cell from each other, and a second portion that insulates the poly gate from the substrate in the MOS transistor. The insulating layer is formed so that its first portion has a smaller thickness than that of its second portion.

13 Claims, 4 Drawing Sheets

U.S. PATENT DOCUMENTS

| | | |
|---|---|---|
| 5,796,139 A | 8/1998 | Fukase |
| 5,808,328 A | 9/1998 | Nishizawa |
| 5,811,853 A | 9/1998 | Wang |
| 5,812,452 A | 9/1998 | Hoang |
| 5,814,853 A | 9/1998 | Chen |
| 5,889,700 A * | 3/1999 | Bergemont et al. .... 365/185.18 |
| 6,054,350 A | 4/2000 | Hsieh et al. |
| 6,091,104 A | 7/2000 | Chen |
| 6,103,573 A | 8/2000 | Harari et al. |
| 6,140,182 A | 10/2000 | Chen |
| 6,222,227 B1 | 4/2001 | Chen |
| 6,284,601 B1 * | 9/2001 | Hoang ........................ 438/258 |
| 6,365,455 B1 | 4/2002 | Su et al. |
| 6,420,753 B1 * | 7/2002 | Hoang ........................ 257/321 |
| 6,429,073 B1 | 8/2002 | Furuhata et al. |
| 6,525,371 B1 | 2/2003 | Johnson |
| 6,949,790 B1 * | 9/2005 | Iwai et al. .................. 257/315 |

* cited by examiner

METHOD OF FORMING DIFFERENT OXIDE THICKNESS FOR HIGH VOLTAGE TRANSISTOR AND MEMORY CELL TUNNEL DIELECTRIC

This application is a divisional application of U.S. application. Ser. No. 10/008,204, filed Dec. 5, 2001 now abandoned.

FIELD OF THE INVENTION

The present invention relates to a method of forming a semiconductor memory array of floating gate memory cells. The present invention also relates to a semiconductor memory array of floating gate memory cells of the foregoing type.

BACKGROUND OF THE INVENTION

Non-volatile semiconductor memory cells using a floating gate to store charges thereon and arrays of such non-volatile memory cells formed in a semiconductor substrate are well known in the art. Typically, such floating gate memory cells have been of the split gate type or stacked gate type. The memory cell utilizes a control gate that is spaced apart and insulated from a floating gate. The control gate can further include a select gate portion. A layer of insulating material (e.g. oxide) is formed between the floating gate and control gate. The thickness of this oxide layer is important because it dictates the level of capacitive coupling between the two gates and it must be thin enough to allow Fowler-Nordheim tunneling for those cells that are erased by tunneling electrons from the floating gate to the control gate.

Typically such memory cells are formed in an array configuration, with peripheral circuitry also formed on the same semiconductor die. The peripheral circuitry often includes one or more high voltage MOS transistors for operating the memory cell array. FIG. 1 illustrates a conventional memory cell 1 from the memory cell area of the die, as well a conventional high voltage MOS transistor 2, all formed on the same semiconductor die 3. The memory cell 1 is a split gate type memory cell. A tunneling oxide layer 4 is formed between the control gate CG and the floating gate FG, with source S and drain D regions formed in the substrate. The transistor 2 includes a poly gate PG that is insulated from the substrate 3 by a gate oxide 5, and overlaps with source S and drain D, where the poly gate PG controls the conductivity of the channel region between the source S and drain D.

Processing efficiency is important in the fabrication of semiconductor devices. Therefore, it is desirable to fabricate corresponding memory and transistor elements using the same processing steps. Thus, the memory cell control gates CG and the transistor poly gates PG are preferably formed using the same polysilicon deposition step. Likewise, the formation of the memory cell tunnel oxide 4 and the transistor gate oxide 5 is formed using the same oxide formation step.

FIGS. 2A to 2D illustrate a conventional method of forming a memory cell in the memory cell area 6 of substrate 3, and a MOS transistor in the peripheral area 7 of substrate 3. Silicon dioxide (hereinafter "oxide") layer 8, polysilicon (hereinafter "poly") layer 9, and silicon nitride (hereinafter "nitride") layer 10 are first formed over the substrate 3. A masking step is used to selectively etch and remove a portion of nitride layer 10, forming a hole 11 that exposes the poly layer 9. The structure is oxidized to form oxide layer 12 over the exposed portion of poly layer 9 at the bottom of hole 11. The resulting structure is shown in FIG. 2A.

Next, a series of etches are used to remove nitride layer 10, and those portions of poly layer 9 and oxide layer 8 not protected by oxide layer 12, as shown in FIG. 2B. Oxide layer 13 is then formed over the structure, followed by the formation of nitride spacers 14, as shown in FIG. 2C. Finally, a poly deposition and masking step is used to form poly block 15 on oxide layer 13 (laterally adjacent and vertically over poly layer 9), and poly block 16 on oxide layer 13 (in peripheral area 7). Ion implantation is used to form source regions 17 and drain regions 18, as shown in FIG. 2D. Poly block 15 forms the memory cell control gate, poly layer 9 forms the memory cell floating gate, and the portion of oxide layer 13 therebetween forms the memory cell tunnel oxide. Poly block 16 forms the transistor poly gate, and the portion of oxide layer 13 underneath poly block 16 forms the gate oxide for the transistor.

This fabrication process illustrates how the oxide layer 13 serves as both the tunnel oxide for the memory cell 1 and the gate oxide for the transistor 2. Thus, the thickness of the tunnel and gate oxides is necessarily the same. However, this is not ideal for devices in which the MOS transistor 2 operates at a higher voltage than does the memory cell 1.

SUMMARY OF THE INVENTION

The present invention solves the aforementioned problem by providing memory cells and MOS transistors on the same silicon substrate, wherein the same oxide layer forms the gate and tunnel oxides, yet the MOS transistor gate oxide thickness is greater than the thickness of the memory cell tunnel oxide.

The present invention is an electrically programmable and erasable memory device that includes a substrate of semiconductor material having a memory area and a peripheral area, a memory cell formed in the memory area of the substrate, and a MOS transistor formed in the peripheral area of the substrate. The memory cell includes an electrically conductive floating gate disposed over and insulated from the substrate, an electrically conductive control gate disposed adjacent to the floating gate, and an insulating layer formed in the memory and peripheral areas that includes a first portion that is disposed between the control gate and the floating gate with a thickness permitting Fowler-Nordheim tunneling of charges therethrough. The MOS transistor includes an electrically conductive poly gate disposed over and insulated from the substrate, and a second portion of the insulating layer being disposed between the poly gate and the substrate and having a thickness that is greater than that of the first portion of the insulating layer. The first and second portions of the insulating layer are initially formed as a continuous layer of material.

In another aspect of the present invention, the electrically programmable and erasable memory device includes a substrate of semiconductor material that includes a memory area and a peripheral area, a memory cell formed in the memory area of the substrate, and a MOS transistor formed in the peripheral area of the substrate. The memory cell includes a first source region and a first drain region formed in the substrate with a first channel region therebetween, an electrically conductive floating gate disposed over and insulated from at least a portion of the first channel region, an electrically conductive control gate disposed adjacent to the floating gate, and an insulating layer formed in the memory and peripheral areas, wherein the insulating layer has a first portion that is disposed between the control gate and the floating gate with a thickness permitting Fowler-Nordheim tunneling of charges therethrough. The MOS transistor includes a second source region and a second drain region formed in the substrate with a second channel region therebetween, an electrically conductive poly gate disposed over and insulated from at least a portion of the second channel region, and a second portion of the insulating layer being disposed between the poly gate and the second channel region, wherein the second portion of the insulating layer has a thickness that is greater than that of the first portion of the insulating layer. The first and second portions of the insulating layer are initially formed as a continuous layer of material.

In yet another aspect of the present invention, a method of making an electrically programmable and erasable memory device includes the steps of forming an electrically conductive floating gate disposed over and insulated from a memory area of a substrate, forming an insulating layer that has a first portion formed over the memory area of the substrate and a second portion formed over a peripheral area of the substrate, wherein the insulating layer first portion has a thickness permitting Fowler-Nordheim tunneling of charges therethrough, changing a thickness of one of the insulating layer first and second portions relative to the other of the insulating layer first and second portions, forming an electrically conductive control gate disposed adjacent to the floating gate and insulated therefrom by the first portion of the insulating layer, and forming an electrically conductive poly gate disposed over the peripheral area of the substrate and insulated therefrom by the second portion of the insulating layer.

In yet one more aspect of the present invention, the method of forming an electrically programmable and erasable memory device includes the steps of forming a memory cell in a memory area of a substrate, and forming an MOS transistor in a peripheral area of the substrate. The memory cell formation includes the steps of forming a floating gate over and insulated from the substrate, and forming a control gate adjacent to and insulated from the floating gate. The MOS transistor formation includes forming a poly gate over and insulated from the substrate. The formation of the memory cell and the formation of the MOS transistor together include the step of forming an insulating layer having a first portion that is disposed between the control gate and the floating gate with a thickness permitting Fowler-Nordheim tunneling of charges therethrough, and a second portion that is disposed between the poly gate and the substrate, wherein the second portion of the insulating layer has a thickness that is greater than that of the first portion of the insulating layer.

Other objects and features of the present invention will become apparent by a review of the specification, claims and appended figures.

DETAILED DESCRIPTION OF THE PREFERRED EMBODIMENTS

The method of the present invention is illustrated in FIGS. 3A–3G, and begins with a semiconductor substrate 30, which is preferably of P type and is well known in the art. The thicknesses of the layers described below will depend upon the design rules and the process technology generation. It will be understood by those skilled in the art that the present invention is not limited to any specific process technology generation, nor to any specific value in any of the process parameters described hereinafter. In addition, the following method description focuses on the formation of a single memory cell and a single MOS transistor, when in fact an array of such memory cells is simultaneously formed in a memory cell area 32 of the substrate 30, and a plurality of such transistors can be simultaneously formed in a peripheral area 34 of the substrate 30. Preferably, such memory cells are formed in columns of active regions that are separated by columns of insulation areas, the formation of which is well known in the art.

Figure 1:
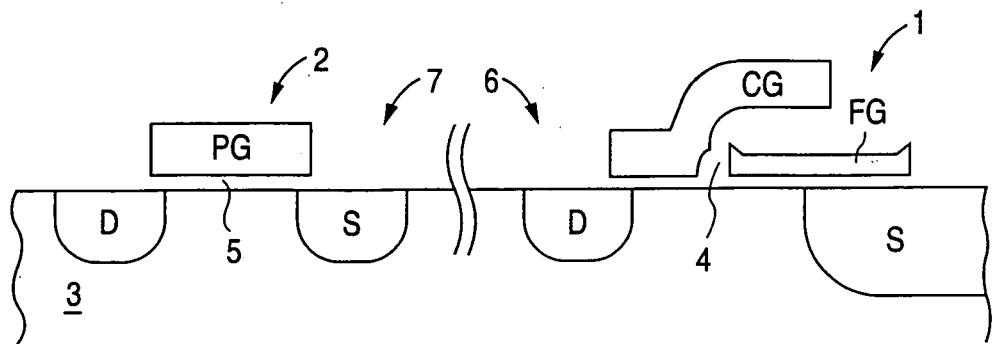
FIG. 1 is a cross sectional view of a conventional memory cell and related peripheral MOS transistor.
Figure 2A:
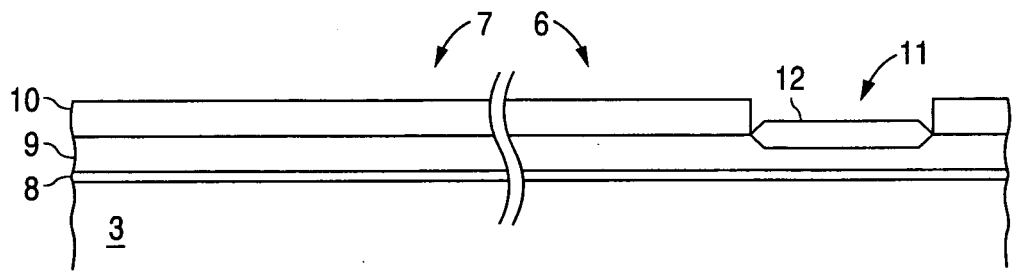
FIGS. 2A–2D are cross sectional views of a conventional semiconductor structure showing in sequence the steps in the processing of the semiconductor structure in the formation of the conventional memory cell and peripheral MOS transistor of FIG. 1.
Figure 2B:
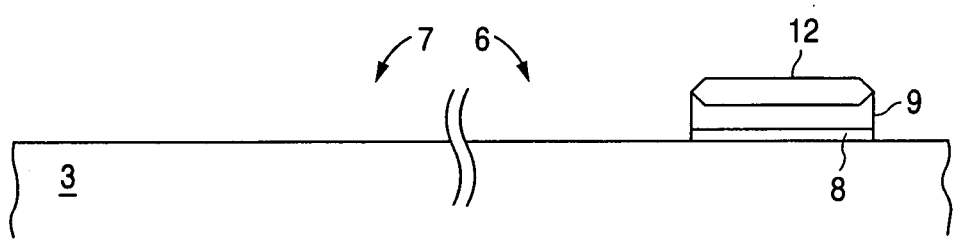
Figure 2C:
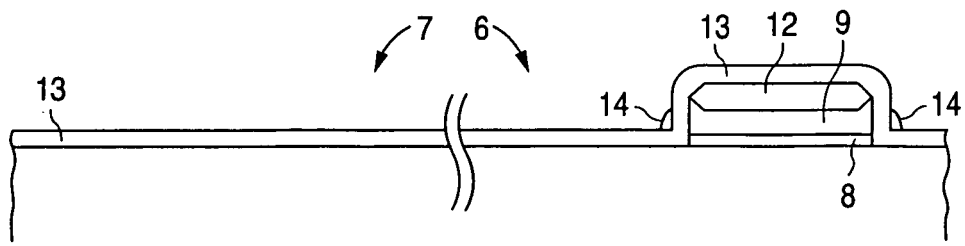
Figure 2D:
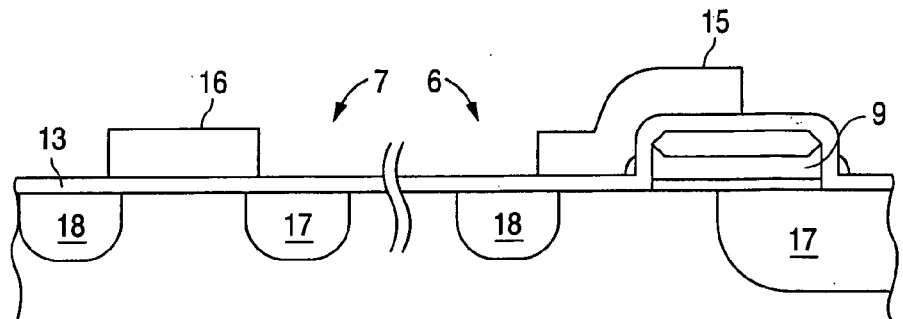
Figure 3A:
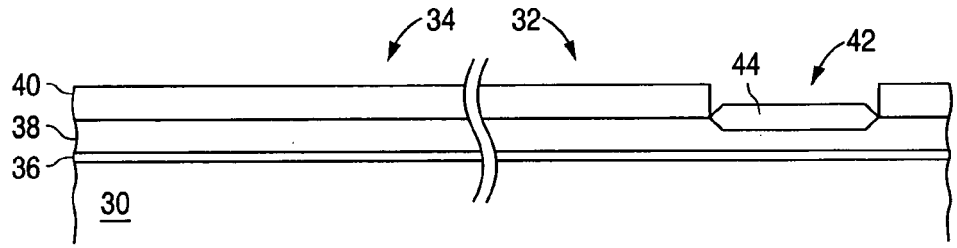
FIGS. 3A–3G are cross sectional views of a semiconductor structure showing in sequence the steps in the processing of the semiconductor structure in the formation of the memory cell and peripheral MOS transistor of the present invention.

As shown in FIG. 3A, a thin layer of insulation material 36, such as oxide having a thickness approximately ~50–150 Å, is formed on substrate 30 by any well known technique such as oxidation or deposition (e.g. chemical vapor deposition or CVD). A layer of conductive material 38, such as polysilicon having a thickness of approximately ~500–2000 Å is deposited on top of the oxide layer 36 by any well known process such as Low Pressure CVD or LPCVD. Poly layer 38 may be doped by ion implantation. Another layer of insulation material 40, such as nitride having a thickness of approximately ~300–500 Å, is deposited over the poly layer 38, preferably by CVD. Layers 36/38/40 are formed in both the memory cell area 32 and the peripheral area 34 of the semiconductor substrate 30. Next, a conventional photolithography scheme is used to form semi-recessed holes or trenches 42 in the structure in the following manner. A suitable photo-resistant material is applied on the nitride layer 40 and a masking step is performed to selectively remove the photo-resistant material from a selected area. Where the photo-resist material is removed, the exposed portion of nitride layer 40 is removed using a standard nitride etch process (e.g. anisotropic nitride etch), leaving a hole or trench 42 that exposes the poly layer 38. The structure is further processed to remove the remaining photo resist. A thermal oxidation process is used to oxidize the exposed portion of poly layer 38 in hole 42, to form a lens-shaped oxide layer 44 over the exposed portion of poly layer 38, as shown in FIG. 3A.

Figure 3B:
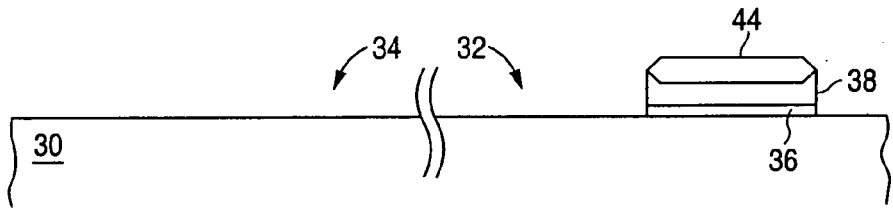

Next, a nitride etch process is used to remove the remaining portions of nitride layer 40. This is followed by anisotropic poly and oxide etch steps to remove those portions of poly layer 38 and oxide layer 36 that are not protected by oxide layer 44. The resulting structure is shown in FIG. 3B.

Figure 3C:
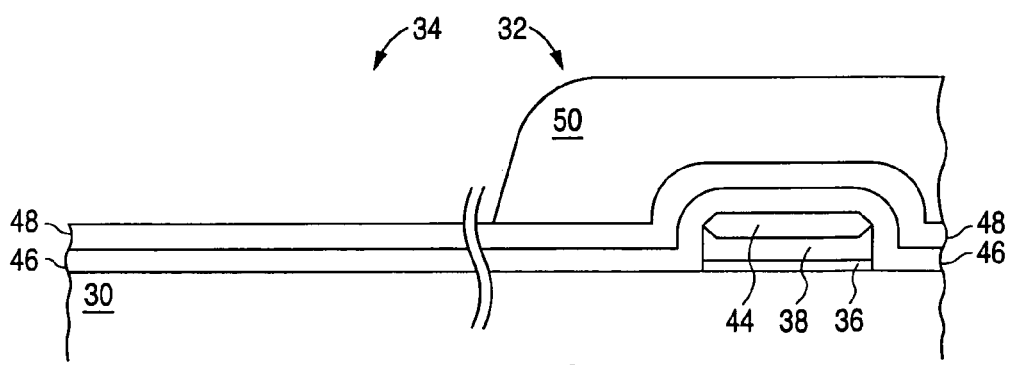
Figure 3D:
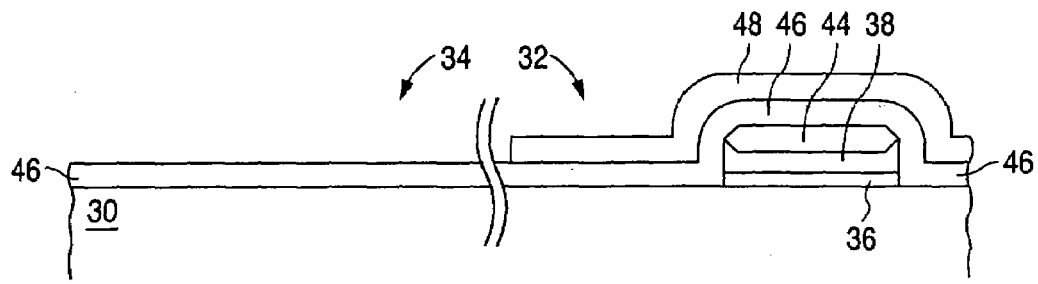

Oxide layer 46 is formed over the structure, preferably using a combination of a high temperature oxide deposition process (HTO) with a thickness of approximately 100–200 Å, and a thermal oxidation process with a thickness of 10–50 Å. A layer of nitride 48 is formed over the oxide layer 46, having a thickness of approximately ~100–300 Å. This is followed by the formation of photo resist material over the structure, and then a masking step in which the photo resist material is removed from the peripheral area 34 only, leaving a layer of photo resist material 50 over the memory cell area 32, as shown in FIG. 3C.

A nitride etch process is used to remove the nitride layer 48 from the peripheral area 34, while nitride layer 48 in the memory cell area 32 (protected by photo resist 50) remains intact. The photo resist 50 is then removed to result in the structure shown in FIG. 3D.

Figure 3E:
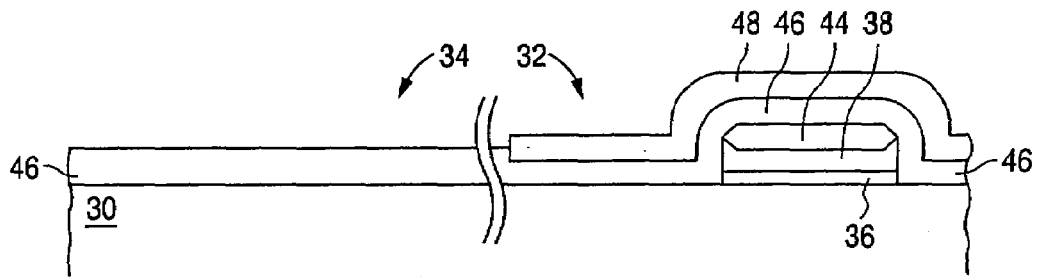

A thermal oxidation is next used to thicken oxide layer 46 in the peripheral area 34, but not in the memory cell area 32. Nitride layer 48 in the memory cell area 32 acts as a mask so that the thermal oxidation process only grows thicker the exposed portion of oxide layer 46 in the peripheral area 34. The resulting structure is shown in FIG. 3E.

Figure 3F:
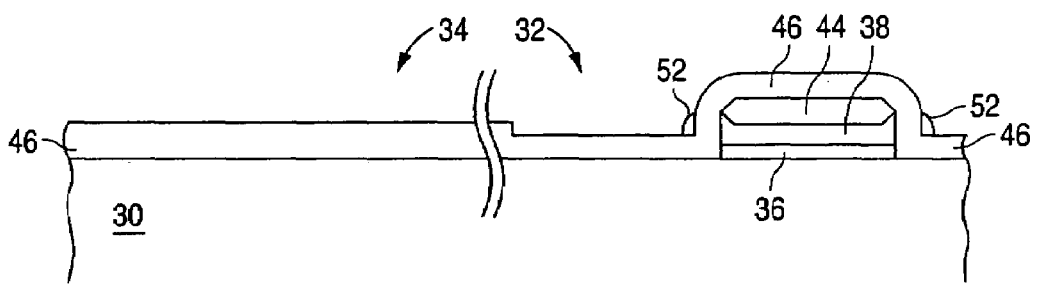
Figure 3G:
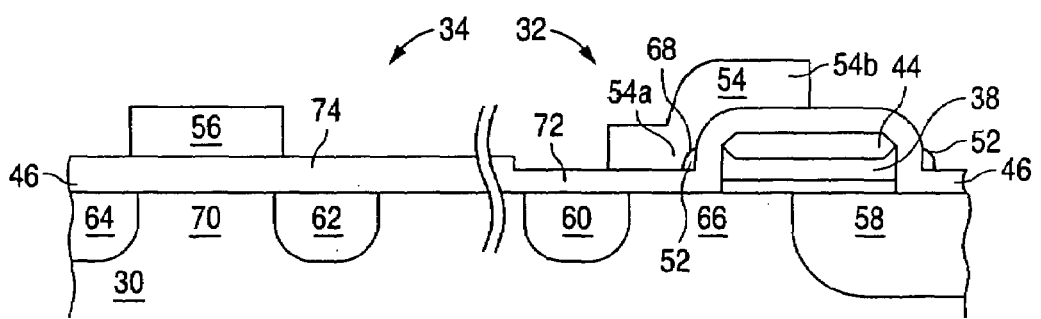

An anisotropic nitride etch is used to remove nitride layer 48, except for nitride spacers 52 formed on either side of the raised portion (over oxide layer 44) of oxide layer 46, as shown in FIG. 3F. Polysilicon is deposited on oxide layer 46, and a masking step is used to remove selected portions of the deposited polysilicon, except for poly block 54 in the memory area 32 and for poly block 56 in the peripheral area 34. In the embodiment shown in FIG. 3G, the poly block 54 has a first portion disposed laterally adjacent to poly layer 38, and a second portion disposed vertically over poly layer 38, with oxide layer 46 disposed between poly layer 38 and poly block 54. Conventional ion implantation is then made across the structure to form source and drain regions 58 and 60 in the memory area 32 of the substrate 30, and source and drain regions 62 and 64 in the peripheral area 34 of the substrate 30. The source and drain regions have a conductivity type that is different from that of the substrate or substrate well in which they are formed. In the preferred embodiment, the source and drain regions are all N+ regions. The resulting structure is shown in FIG. 3G.

In the memory cell area 32, a channel region 66 is defined in the substrate between the source 58 and drain 60. Poly layer 38 forms the cell's floating gate, which is disposed over and insulated from a first portion of the channel region 66 and a portion of the source region 58. Poly block 54 forms the cell's control gate, which includes a first portion 54a that is disposed over and insulated from a second portion of the channel region 66 and a portion of the drain 60, and is laterally adjacent to and insulated from the floating gate 38. The control gate 54 has a second portion 54b that is disposed over (vertically adjacent to) and insulated from the floating gate 38. A notch 68 is formed in the control gate 54 by the nitride spacer 52, which helps prevent reverse tunneling back to the floating gate or to the substrate. The non-volatile memory cell is of the split gate type as described in U.S. Pat. No. 5,572,054, which discloses the operation of such a non-volatile memory cell and an array formed thereby, and is hereby incorporated herein by reference.

In the peripheral area 34, a channel region 70 is defined in the substrate between the source 62 and drain 64. Poly block 56 forms the transistor cell's poly gate, which is disposed over and insulated from the channel region 70.

Oxide layer 46 has two separate portions: a thinner portion 72 formed in the memory cell area 32 of the substrate 30, and a thicker portion 74 formed in the peripheral area 34 of the substrate 30. Part of the thinner portion 72 of oxide layer 46 forms the tunnel oxide of the memory cell through which electrons tunnel for memory cell operation (e.g. erase operation). Part of the thicker portion 74 of the oxide layer 46 forms the gate oxide of the MOS transistor which insulates the poly gate 56 from the substrate 70. Because the gate oxide of the MOS transistor is formed on a thicker portion of oxide layer 46 than is the tunneling oxide of the memory cell, the MOS transistor can better operate at a higher voltage than that of the memory cell. In the preferred embodiment, the control gate is raised to an erase voltage of approximately 7 to 15 volts, and the MOS transistor operates at 1 or 2 volts above that erase voltage. This difference of 1–2 volts provides a margin for better reliability in the operation of the semiconductor memory device.

Figure 4A:
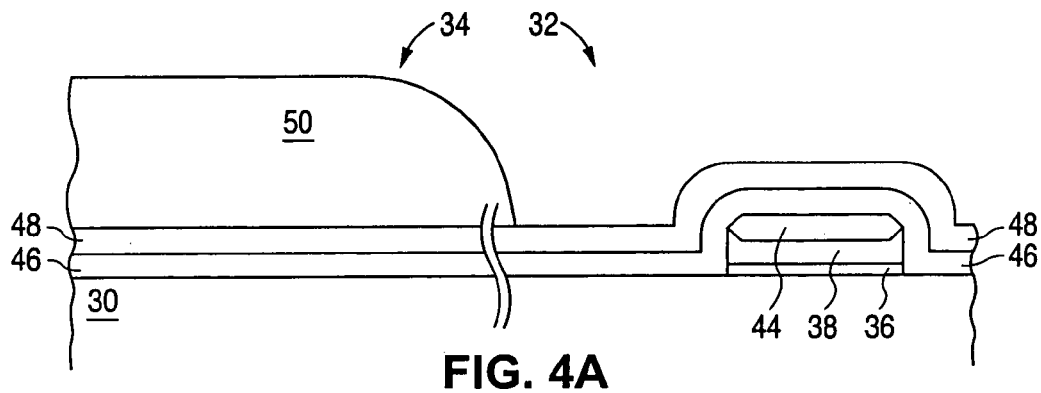
FIGS. 4A–4C are cross sectional views of a semiconductor structure showing in sequence the steps in an alternate embodiment of the processing of the semiconductor structure shown in FIG. 3C.
Figure 4B:
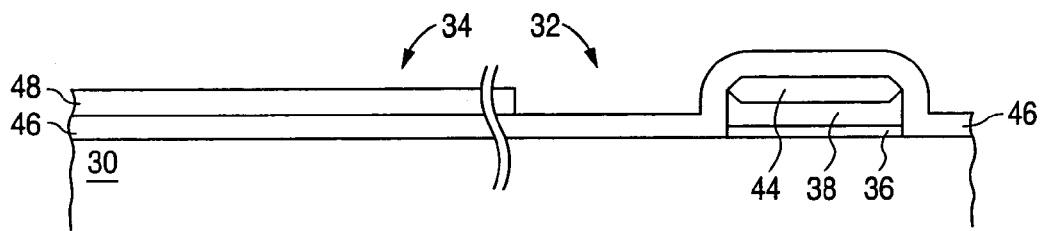
Figure 4C:
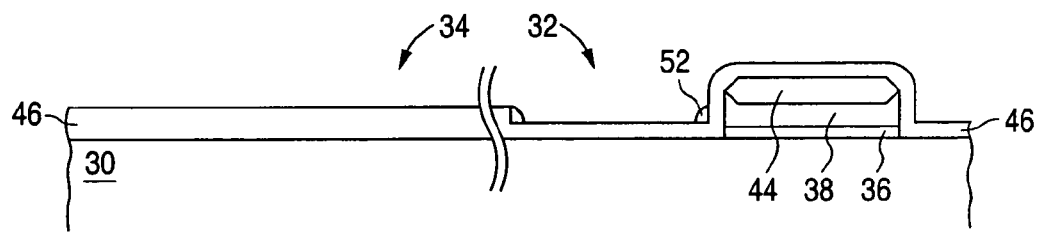

FIGS. 3A–3G show the formation of oxide layer 46 over both the peripheral area 34 and the memory cell area 32, and then thickening of the oxide layer 46 only in the peripheral area 34. Alternately, however, the thickness of the oxide layer 46 in the memory cell area can be reduced, resulting in the same relative thicknesses of oxide layer 46 in the peripheral and memory cell areas 34/32. FIGS. 4A–4C illustrate an alternate embodiment of the present invention, which essentially involves the same processing steps as previously described with respect to FIGS. 3A–3G, but with the following exceptions. This alternate embodiment begins with the same structure as shown in FIG. 3C, except that the thickness of oxide layer 46 is greater, and the photo resist 50 is formed over the peripheral area 34 instead of memory cell area 32, as shown in FIG. 4A.

The subsequent nitride etch process removes the nitride layer 48 from the memory cell area 32, while nitride layer 48 in the peripheral area 34 (protected by photo resist 50) remains intact. The photo resist 50 is then removed to result in the structure shown in FIG. 4B.

An oxide etch process is then used to reduce the thickness of oxide layer 46 in the memory cell area 34, but not in the peripheral area 34. The nitride layer 48 in the peripheral area 34 acts as a mask so that the oxide etch process only removes the top exposed portion of oxide layer 46 in the memory cell area 32. The resulting structure is shown in FIG. 4C, which is further process as described above with respect to FIG. 3G. It should be noted that nitride layer 48 is optional in this embodiment, and that a nitride deposition and removal step can be used to add the nitride spacer 52 to prevent reverse tunneling back to the floating gate or to the substrate in the finished memory cell.

It is to be understood that the present invention is not limited to the embodiment described above and illustrated herein, but encompasses any and all variations falling within the scope of the appended claims. For example, the invention is disclosed in the context of a split gate memory device, but it is also applicable to any memory cell design that includes a tunneling oxide between two conductive elements, where the tunneling oxide layer extends to the substrate's peripheral area to form the gate oxide of a MOS transistor. Further, although the foregoing method describes the use of appropriately doped polysilicon as the conductive material used to form the memory cells, it should be clear to those having ordinary skill in the art that any appropriate conductive material can be used. In addition, any appropriate insulator can be used in place of silicon dioxide or silicon nitride. Moreover, any appropriate material whose etch property differs from silicon dioxide (or any insulator) and from polysilicon (or any conductor) can be used in place of silicon nitride. Further, as is apparent from the claims, not all method steps need be performed in the exact order illustrated or recited in the claims, but rather can be performed in any order that allows the proper formation of the memory cell and MOS transistor of the present invention. Finally, while oxide layer 46 is formed over the both the peripheral and memory cell areas 34/32 as a single layer of material, this oxide layer could in fact be formed of multiple layers of insulating material, and could later be made discontinuous by the formation of holes or trenches therein.

What is claimed is:

1. A method of making an electrically programmable and erasable memory device, comprising:
   forming an electrically conductive floating gate disposed over and insulated from a memory area of a substrate;
   forming an insulating layer that has a first portion formed over the memory area of the substrate and a second portion formed over a peripheral area of the substrate, wherein the insulating layer first portion has a thickness permitting Fowler-Nordheim tunneling of charges therethrough;
   changing a thickness of one of the insulating layer first and second portions such that the insulating layer first and second portions have unequal thicknesses;
   forming an electrically conductive control gate disposed adjacent to the floating gate and insulated therefrom by the first portion of the insulating layer; and
   forming an electrically conductive poly gate disposed over the peripheral area of the substrate and insulated therefrom by the second portion of the insulating layer.

2. The method of claim 1, further comprising:
   forming a first source region and a first drain region in the substrate, with a first channel region therebetween, wherein the floating gate is disposed over and insulated from at least a portion of the first channel region; and
   forming a second source region and a second drain region in the substrate, with a second channel region therebetween, wherein the poly gate is disposed over and insulated from at least a portion of the second channel region.

3. The method of claim 1, wherein the formation of the control gate and the poly gate includes:
   depositing a layer of conductive material over the insulating layer; and
   selectively removing portions of deposited conductive material except for a first portion thereof forming the control gate and a second portion thereof forming the poly gate.

4. The method of claim 1, wherein the changing of the thickness of one of the insulating layer first and second portions includes:
   forming a layer of material over the insulating layer;
   masking a first portion of the layer of material formed over the first portion of the insulating layer, wherein a second portion of the layer of material formed over the second portion of the insulating layer is left unmasked;
   removing the unmasked second portion of the layer of material to expose the second portion of the insulating layer; and
   increasing the thickness of the exposed second portion of the insulating layer.

5. The method of claim 4 wherein the increasing of the thickness of the exposed insulating layer second portion includes thermally oxidizing the exposed insulating layer second portion.

6. The method of claim 1, wherein the changing of the thickness of one of the insulating layer first and second portions includes:
   forming a layer of material over the insulating layer;
   masking a first portion of the layer of material formed over the second portion of the insulating layer, wherein a second portion of the layer of material formed over the first portion of the insulating layer is left unmasked;
   removing the unmasked second portion of the layer of material to expose the first portion of the insulating layer; and
   removing a top portion of the exposed first portion of the insulating layer.

7. A method of forming an electrically programmable and erasable memory device, comprising:
   forming a memory cell in a memory area of a substrate, wherein the memory cell formation includes:
      forming a floating gate over and insulated from the substrate, and
      forming a control gate adjacent to and insulated from the floating gate;
   forming an MOS transistor in a peripheral area of the substrate, wherein the MOS transistor formation includes forming a poly gate over and insulated from the substrate;
   wherein the formation of the memory cell and the formation of the MOS transistor together include:
      forming an insulating layer having a first portion that is disposed between the control gate and the floating gate with a thickness permitting Fowler-Nordheim tunneling of charges therethrough, and a second portion that is disposed between the poly gate and the substrate, wherein the second portion of the insulating layer has a thickness that is greater than that of the first portion of the insulating layer.

8. The method of claim 7, further comprising:
   forming first source and drain regions with a first channel region therebetween in the substrate, wherein the floating gate is disposed over at least a portion of the first channel region; and
   forming second source and drain regions with a second channel region therebetween in the substrate, wherein the poly gate is disposed over at least a portion of the second channel region.

9. The method of claim 7, wherein the formation of the insulating layer includes:
   forming the first and second portions of the insulating layer with a uniform thickness over the memory and peripheral areas of the substrate; and
   changing the thickness of one of the insulating layer first and second portions such that the insulating layer first and second portions have unequal thicknesses.

10. The method of claim 9, wherein the changing of the thickness of one of the insulating layer first and second portions includes:
    forming a layer of material over the insulating layer;
    masking a first portion of the layer of material formed over the insulating layer first portion, wherein a second portion of the layer of material formed over the second portion of the insulating layer is left unmasked;
    removing the unmasked second portion of the layer of material to expose the insulating layer second portion; and
    increasing the thickness of the exposed second portion of the insulating layer.

11. The method of claim 10 wherein the increasing of the thickness of the exposed insulating layer second portion includes thermally oxidizing the exposed insulating layer second portion.

12. The method of claim 9, wherein the changing of the thickness of one of the insulating layer first and second portions includes:
    forming a layer of material over the insulating layer;

masking a first portion of the layer of material formed over the second portion of the insulating layer, wherein a second portion of the layer of material formed over the first portion of the insulating layer is left unmasked;

removing the unmasked second portion of the layer of material to expose the first portion of the insulating layer; and removing a top portion of the exposed first portion of the insulating layer.

13. A method of forming an electrically programmable and erasable memory device, comprising:

forming a memory cell in a memory area of a substrate, wherein the memory cell formation includes:

forming a floating gate over and insulated from the substrate, and forming a control gate adjacent to and insulated from the floating gate;

forming an MOS transistor in a peripheral area of the substrate, wherein the MOS transistor formation includes forming a poly gate over and insulated from the substrate;

wherein the formation of the memory cell and the formation of the MOS transistor together include:

forming an insulating layer having a first portion that is disposed between the control gate and the floating gate with a thickness permitting Fowler-Nordheim tunneling of charges therethrough, and a second portion that is disposed between the poly gate and the substrate, wherein the second portion of the insulating layer has a thickness that is greater than that of the first portion of the insulating layer; and wherein the formation of the control gate and the poly gate includes:

depositing a layer of conductive material over the insulating layer; and selectively removing portions of deposited conductive material except for a first portion thereof forming the control gate and a second portion thereof forming the poly gate.

* * * * *